(12) United States Patent
Stocker

(10) Patent No.: US 6,881,130 B1
(45) Date of Patent: *Apr. 19, 2005

(54) EDGE GRINDING

(75) Inventor: Mark Andrew Stocker, East Hunsbury (GB)

(73) Assignee: UNOVA U.K. Limited, Buckinghamshire (GB)

( * ) Notice: Subject to any disclaimer, the term of this patent is extended or adjusted under 35 U.S.C. 154(b) by 0 days.

This patent is subject to a terminal disclaimer.

(21) Appl. No.: 10/018,767

(22) PCT Filed: Apr. 20, 2000

(86) PCT No.: PCT/GB00/01562

§ 371 (c)(1),
(2), (4) Date: Jun. 7, 2002

(87) PCT Pub. No.: WO01/02133

PCT Pub. Date: Jan. 11, 2001

(30) Foreign Application Priority Data

Jul. 3, 1999 (GB) ............................................. 9915557

(51) Int. Cl.[7] ............................................... B24B 1/00
(52) U.S. Cl. .................. 451/44; 451/5; 451/6; 451/140; 451/146; 451/256; 451/258; 51/165.71; 51/104
(58) Field of Search .......................... 451/44, 5, 6, 140, 451/146, 254, 258; 51/165.71, 165.72, 104, 105

(56) References Cited

U.S. PATENT DOCUMENTS

| 5,185,965 | A | * | 2/1993 | Ozaki | 451/5 |
| 5,271,185 | A | * | 12/1993 | Hosokawa | 451/136 |
| 5,289,661 | A | * | 3/1994 | Jones et al. | 451/44 |
| 6,220,938 | B1 | * | 4/2001 | Stocker et al. | 451/49 |
| 6,267,647 | B1 | * | 7/2001 | Stocker et al. | 451/44 |
| 6,428,397 | B1 | * | 8/2002 | Stocker | 451/44 |

* cited by examiner

Primary Examiner—Joseph J. Hail, III
Assistant Examiner—Alvin J Grant
(74) Attorney, Agent, or Firm—Reising, Ethington, Barnes, Kisselle, P.C.

(57) ABSTRACT

A method of positioning a grooved grinding wheel relative to a disc-like circular workpiece for edge grinding the workpiece using the groove in the wheel includes the steps of mounting the workpiece for rotation about a first axis, mounting the grinding wheel for rotation about a second parallel axis, effecting relative movement between the workpiece and the wheel to engage the rim of the wheel within the groove and performing a preliminary grind. The position of the wheel is axially adjusted in accordance with the measurements made on the profile of the rim produced by the preliminary grind, and the rim is ground again with a second preliminary grind with the grinding wheel located at the axially shifted position. The steps of grinding and measuring the periphery of the workpiece are repeated until the rim profile possesses the desired accuracy. The final position of the grooved grinding wheel is then utilized for grinding future wafers.

34 Claims, 1 Drawing Sheet

EDGE GRINDING

BACKGROUND OF THE INVENTION

1. Field of Invention

This invention concerns edge grinding methods and apparatus. In particular it relates to methods and apparatus for edge grinding wafers of semi-conductor material so as to produce an accurate peripheral profile.

2. Description of Related Art Including Information Disclosed Under 37 CFR 1.97 and 1.98.

The present invention seeks to provide a process which grinds the overall diameter of a wafer to the desired accuracy, typically to better than 10 microns, and apparatus for performing the grinding processes required and ensuring that the desired accuracy is maintained.

It is an object of the invention that the method and apparatus should be applicable to both notch grinding and edge grinding processes, each of which are applicable to the grinding of semi-conductor wafers.

The peripheral profile of a semi-conductor wafer is typically triangular in cross-section with the apex of the triangle accurately positioned relative to the two flat faces of the semi-conductor disc. Typically the position of the apex of the triangular cross-section relative to the thickness of the wafer (which itself is very carefully controlled) has to be better than 10 microns.

Edge grinding is performed using grooved grinding wheels which rough, semi-finish and finish grind the edge profile. The profile is then polished as a final manufacturing step.

A small notch is normally formed at one point around the circumference of such a semi-conductor wafer and typically this is formed using another grooved grinding wheel, albeit of very small diameter.

Generally speaking it is also important that the edge profile is continued accurately around the inside of the notch.

The overall process typically comprises the steps of rough grinding the periphery of a wafer so as to form two frusto-conical surfaces which converge to an annular ridge which defines the maximum overall diameter of the wafer, semi-finish grinding, to size, finish grinding to low tolerances, and finally polishing the ground surfaces.

Since polishing removes virtually no material, and a finish grinding step is almost akin to polishing, it is important that the rough grinding and semi-finish grinding steps position the two frusto-conical surfaces as accurately as possible relative to the faces of the wafer and thereby position the annular ridge defined by the two converging surfaces to the required degree of accuracy relative to the thickness of the wafer.

It is therefore an object of the present invention to provide a method and apparatus for forming a groove in a grinding wheel which will accurately form the desired profile around a wafer.

It is another object of the invention to provide a method and apparatus for positioning a grinding wheel relative to a wafer so as to grind frusto-conical surfaces around the edge of the water to define an annular rim and to position the latter accurately relative to the thickness of the wafer.

It is an object of the invention also to provide a process which will be applicable whether the grooved grinding wheels are formed and re-formed in situ, or have to be demounted from the machine to be re-formed.

BRIEF SUMMARY OF THE INVENTION

According to one aspect of the present invention, a method of positioning a grooved grinding wheel relative to a disc-like circular workpiece for edge grinding the latter using the groove in the wheel to produce two converging frusto-conical surfaces around the rim of the workpiece (and position the line of convergence accurately relative to the thickness of the workpiece), comprises the steps of mounting the workpiece for rotation about a first axis, mounting the grooved grinding wheel for rotation about a second parallel axis, effecting relative movement between the workpiece and the wheel to engage the rim of the wheel within the groove, performing a preliminary grind, separating the wheel from the wafer, measuring the peripheral rim of the wafer to determine the accuracy of its form relative to a template or to stored data relating to the desired form, axially adjusting the position of the wheel and therefore the groove in response to the measurements made on the profile of the rim produced by the preliminary grind, re-grinding the rim with a second preliminary grind with the grinding wheel located at the axially shifted position, measuring the profile of the ground rim of the workpiece as before, adjusting the axial position of the grinding wheel again, re-grinding the ground periphery of the workpiece and repeating the measuring and axial shifting steps until the rim profile possesses the desired accuracy, and utilising the final position of the grooved grinding wheel for grinding future wafers.

For this method to be useful, it is probably necessary to inspect the edge of the workpiece in situ so that there is no time wasted in demounting and re-mounting the workpiece each time the previous preliminary grind is to be checked.

According to a another preferred aspect of the invention a sequence of preliminary grinds are formed one after the other around the ring of a circular workpiece, with a small axial shift of the grinding wheel between each preliminary grind, each said preliminary grind being performed over only a small arcuate extent of the overall circumference of the rim, the rotational position of each said preliminary grind and the corresponding axial position of the grooved grinding wheel being noted and stored for future reference, and the profile obtained by each of the succession of preliminary grinds is measured, and the axial position for future grinds is determined by reference to the result obtained from each of the different preliminary grinds by selecting the axial position for the wheel which gave the best profile.

The preliminary grinds may be measured whilst the workpiece is still mounted in the grinding station, or the workpiece may be de-mounted and taken to an inspection location for the preliminary grinds around its periphery to be measured.

Since the position of the ridge relative to the two faces of the wafer is the same (for any given axial position of the grooved grinding wheel) arid is independent of the amount of material removed from the edge of the wafer, the preferred modification described above is particularly advantageous in that it is only necessary to make a small radial excursion into the periphery of the wafer to form each preliminary grind for the subsequent measurements on the ground profile to reveal whether or not the position of the grooved grinding wheel is correct or not, and according to a further preferred feature of this modification of the invention, the preliminary grinds do not encroach into the final size of the wafer so that after the succession of preliminary grinds has been completed and the correct position for the grooved grinding wheel has been selected, a final grinding step performed on the wafer will allow the latter to be ground to size with the peripheral profile correctly located relative to the two parallel faces of the wafer.

The preferred modification can be used for positioning edge grinding wheels and notch grinding wheels.

The preferred modification of the invention is particularly useful for positioning grinding wheels which cannot be formed and re-formed in situ. The method is therefore particularly applicable to metal bonded wheels.

The preferred modification is also of advantage in that it can be used to open a resin bonded wheel so that a better finish is produced by the wheel when the first notch is properly ground after a groove forming or re-forming step. This arises from the fact that when forming a groove in a bonded wheel, the groove forming step leaves the surface of the groove relatively smooth with grit which will actually grind the frusto-conical surfaces of the wafer edge buried beneath the smooth bonding material. It is only after the grooved wheel has been used to grind the periphery of a wafer that the less hard bonding material is abraded away, and grit is exposed. The initial grinding step is known as conditioning, and the process is described as opening up the wheel. This is of particular importance in the case of resin bonded wheels, but may also apply to vitreous material bonded wheels.

The sequence of preliminary grinds exposes the grit around the surfaces of the groove in the grinding wheel and conditions the groove so that when the wheel is then used to grind the periphery of the wheel to size, the surfaces of the groove in the grinding wheel will be open and the grit exposed so that proper grinding of the edge profile will result.

According to a further aspect of the invention, a method of conditioning a grinding wheel in which a groove has been formed, comprises the steps of engaging the underconditioned groove with part of the periphery of the wafer, rotating the wafer through a small angle so as to perform a shallow grind over a small arcuate extent of the rim of the wafer, disengaging the wheel from the wafer and axially shifting the wheel or the wafer before re-engaging and performing a similar grind over another arcuate region of the wafer and performing a sequence of such steps around part or all of the circumference of the wafer thereby to remove bonding material from the surface of the groove in the grinding wheel and expose the grinding grit, and thereby condition the wheel.

According to a preferred feature of this aspect of the invention, the depth to which each of the arcuate grinds is performed is limited so as not to encroach into the useful material from which the wafer is constructed, so that a final grinding process performed on the wafer so as to remove the remainder of the extraneous material from the periphery of the wafer will still leave a full size wafer with a correctly formed profile around its periphery.

The process of performing a sequence of shallow arcuate grinds around a wafer as aforesaid will be referred to as a creep feed grind process, and by performing a creep feed grinding process as aforesaid, the overall noise associated with the grinding process will be reduced.

Creep feed grinding so as to condition a grooved wheel is of particular application to a resin bonded notch grinding wheel which tends to be of very small diameter.

In general it is not possible to form and re-form metal bonded grinding wheels in situ, and hitherto it has been normal to demount such wheels from a grinding machine and form and re-form them at a different location and then re-mount the wheels on the machine. This necessitates a groove aligning procedure as described in accordance with the preferred modification of the invention, and according to a further aspect of the invention, a method of forming and re-forming grinding wheels, particularly metal grinding wheels is provided which can be performed in situ.

According to this aspect of the invention, in an edge grinding machine in which a workpiece is rotated relative to a rotating grinding wheel having a groove formed in its surface for grinding the periphery of the workpiece to size and shape, a spark erosion electrode is mounted for rotation with the workpiece and the wheels to be formed and reformed are axially shifted and advanced so that the region thereof which is to be formed with a groove or containing a groove which is to be re-formed, can be engaged by the spark erosion electrode as the latter rotates about the workpiece axis, and forming and re-forming of the groove in the grinding wheel is performed by rotating the grinding wheel at high speed whilst simultaneously rotating the electrode around the workpiece axis so that spark erosion is performed around the whole of the circumference of the groove.

According to another aspect of the invention, spark erosion may be employed to form the external peripheral surface of a forming wheel carried by a work spindle, the forming wheel being used in practice to form and re-form grooves in grinding wheels for grinding the edge profile and the notch profile of a wafer mounted for rotation about the same axis as the forming wheel in which a stationary grooved electrode is mounted to the machine and is adapted to be moved into close proximity to the edge of the forming wheel mounted on the workpiece spindle so that part of the arcuate extent of the said circumference is embraced by a groove within the electrode and spark erosion is performed as the forming wheel is rotated so as to form the desired profile around the periphery of the forming wheel to enable it to continue to perform its forming and re-forming task.

The invention therefore provides for electro-discharge machining of circumferential grooves in grinding wheels and for forming the external profile of a forming wheel in an edge grinding machine of which spark erosion is one preferred technique.

Thus the invention also lies in a machine having fitted thereon an arcuate electrode adapted to be moved towards and away from the edge of a forming wheel, mounting a forming wheel on a work spindle to the rear of a workpiece mounting device such as a vacuum chuck, and providing means for advancing the electrode so that a groove therein embraces the edge of the forming wheel to allow electro-discharge machining to be performed on the external circumference of the forming wheel.

Where the forming wheel is a metal bonded grinding wheel, it can be used as an electrode in an electro-discharge machining process for forming and re-forming grooves in edge grinding wheels and notch grinding wheels mounted on the same edge grinding machine. By moving a grooved edge grinding wheel axially so as to align with the region thereof in which the groove is to be formed (or in which the groove which is to be re-formed occupies), is aligned with the forming wheel, and advancing the grinding wheel towards the forming wheel, so a groove can be formed in the surface of the wheel by electro-discharge machining or an existing groove conditioned and re-formed as the wheel rotates relative to the periphery of the forming wheel electrode.

Typically both the wheel and electrode are rotated.

In exactly the same way, a groove in a notch grinding wheel can be formed and re-formed.

Whether the electrode comprises a metal bonded grinding wheel or is a separate metal disc, it is conveniently located to the rear of a vacuum chuck on which a disc-like workpiece will normally be mounted. Alternatively a separate disc electrode may be employed which is also adapted to be mounted on the workpiece mounting device attached to the workpiece spindle for rotation thereby in place of a workpiece.

The measurement of the profile of the ground periphery of the workpiece may be measured using an optical inspection system enabling the profile to be checked by eye, to be checked against a profile or to be optically projected onto a photoelectric device such as a CCD camera or the like, whereby a video signal can be produced for processing and/or display on a visual display unit. If video signals are obtained, they may be stored, processed, compared with template signals, subjected to an algorithm to determine the shape of the device which produces the signals and otherwise measured and investigated to determine the correctness or otherwise of the ground profile. If displayed on a visual display unit, the enlarged display of the profile may be checked by eye and may also be checked against an optical profile device which may be offered up to the screen of the visual display unit for comparison purposes.

BRIEF DESCRIPTION OF THE SEVERAL VIEWS OF THE DRAWINGS

The invention is of particular application to disc-like circular wafers of semi-conductor material, particularly silicon.

The invention will now be described by way of example, with reference to the accompanying drawings in which.

DETAILED DESCRIPTION OF THE INVENTION

Figure 1:
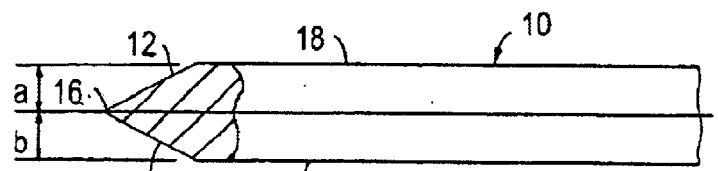
FIG. 1 illustrates to an enlarged scale in cross-section, part of the edge region of a semi-conductor wafer workpiece.

FIG. 1 comprises a view of part of a disc-like wafer of semi-conductor material from which semi-conductor chips are to be formed by electron-beam microfabrication (EBMF) techniques or the like. For accurately locating such a wafer within an EBMF machine, the periphery of the disc is formed with a triangular cross-section made up of two frusto-conical surfaces 12 and 14 which meet in an annular ridge 16. The position of the ridge 16 relative to the flat faces 18 and 20 of the disc 10 must be accurate typically to within 10 microns so that distances a and b are maintained to a given level of accuracy from one wafer to another.

Figure 2:
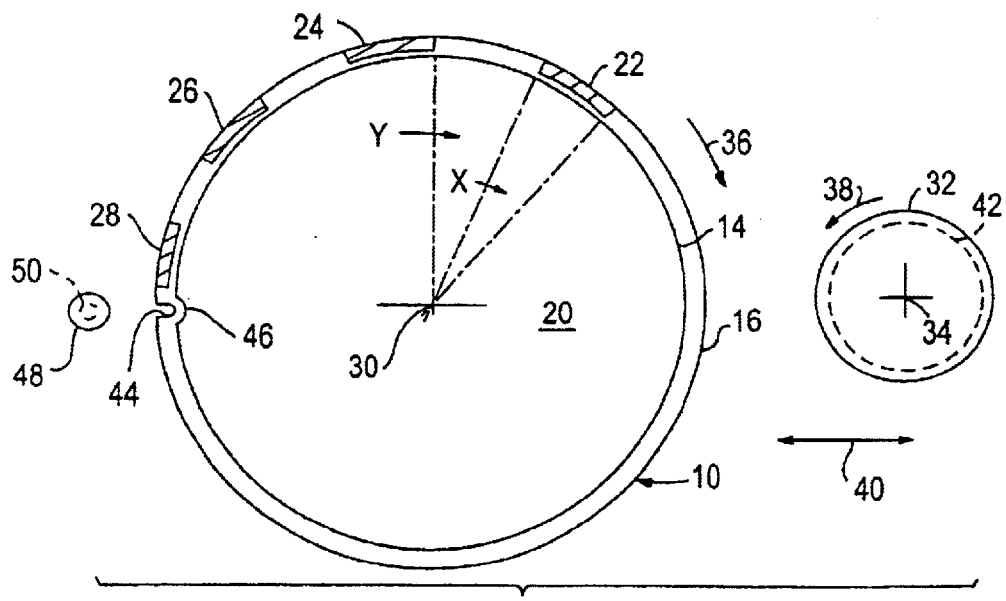
FIG. 2 is a plan view of a circular workpiece on which a number of preliminary grinds have been performed around the periphery thereof using the same grooved grinding wheel, but in which the wheel has been shifted axially by a small distance between each of the grinds.

FIG. 2 is a plan view of one side of the wafer 10 showing the complete annular frusto-conical surface 14 extending between the face 20 and the peripheral rim 16 after a series of creep feed grinds have been made in the edge of the disc as denoted by reference numerals 22, 24, 26 and 28 respectively. These are achieved by engaging the rim of the wafer 10 in a groove of a grooved grinding wheel rotating at high speed about an axis which is parallel to the axis 30 about which the wafer 10 can be rotated, and incrementally rotating the disc 10 whilst so engaged with the groove of the grinding wheel through a small arcuate distance such as X as shown in FIG. 2.

In this way part of the edge region is ground away by the groove in the grinding wheel and will appear as a ground region 22 over the arcuate extent of engagement of the rim of the wheel with the grinding wheel during the incremental grind. In accordance with the preferred method of the invention, the wheel is disengaged whilst the wafer is rotated through another arcuate distance Y (which may be very small if preferred), and after axially shifting the grinding wheel relative to the workpiece, the edge of the wafer is again engaged by the groove in the grinding wheel and another region (24) of the rim is ground. Typically the arcuate extent of each of the ground regions 22, 24 etc is similar, and the spacing between successive ground regions is also similar.

Although indicated in FIG. 2 as being of similar extent to the arcuate extent of each of the ground regions, the regions separating each of the different ground regions may be infinitessimately small if a large number are to be formed around the periphery of the disc.

The grooved grinding wheel is denoted by reference numeral 32 in FIG. 2, and its axis of rotation by 34.

The direction of rotation of the disc 10 is denoted by arrow 36 and a typical direction of rotation for the grinding wheel 32 is denoted by arrow 38.

The movement of the wheel 32 relative to the disc 10 to engage and dis-engage the groove in the wheel with the edge of the disc, is denoted by arrow 40 and the groove shown in dotted outline in FIG. 2 is denoted by reference numeral 42.

Wheel 32 is of relatively large diameter and serves to grind the periphery of the disc 10 as described.

Semi-conductor wafers normally require a notch to be formed at one point around their circumference, and such a notch is shown at 44 in FIG. 2. The notch is formed by a small diameter grinding wheel and the specification for most wafers is that the notch must merge with each side face of the wafer with a similar smooth frusto-conical surface, one of which is denoted by reference numeral 46 in FIG. 2. To this end the notch 44 is preferably formed by means of a grooved grinding wheel such as 48 having a small diameter groove shown in dotted outline at 50. By forming the groove with frusto-conical faces complementary to the frusto-conical surfaces around the notch, the engagement of the wheel 50 with the wafer and the grinding of a notch will result in appropriate frusto-conical surfaces being formed by the grinding process around the notch itself.

The angle between the two faces of the groove in the wheel 32 and in the wheel 48 is preferably the same so that the surfaces ground by the two wheels, one around the periphery and the other around the notch, will be substantially the same.

Figure 3:
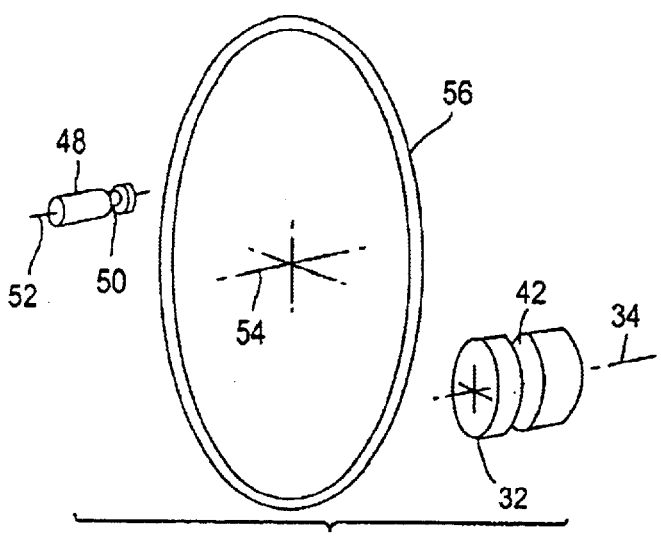
FIG. 3 is a perspective view showing a circular electrode and a notch grinding wheel on one side, and an edge grinding wheel on the other showing how grooves in both of the grinding wheels can be formed and re-formed by electro-discharge machining.

FIG. 3 shows in perspective view the edge grinding wheel 32 and the notch grinding wheel 48 of FIG. 2, and in each case the groove can be seen in the surface of the wheel as at 42 in the case of the larger wheel 32, and at 50 in the case of the smaller notch grinding wheel 48.

The axis about which the edge grinding wheel 32 rotates is denoted by reference numeral 34 as in FIG. 2, and the axis about which the notch grinding wheel rotates is denoted by reference numeral 52 in FIG. 3.

The axis about which a disc which is to be edge ground and notch ground rotates is denoted by reference numeral 54 in FIG. 3.

The disc-like object 56 in FIG. 3 could be thought of as comprising the workpiece, but in accordance with another aspect of the invention, may itself comprise a conductive metal disc which forms an electro-discharge machining electrode. This is substantially the same in dimensions and peripheral shape to the disc-like workpiece shown in FIG. 1, except that the rim is formed very accurately with the desired triangular cross-sectional shape, with the apex of the triangle at precisely the correct position relative to the two parallel faces of the electrode. By moving the wheel 32 so as to introduce the edge of the electrode 56 into the groove 42, electro-discharge machining will occur as the two items are rotated provided an appropriate electrical current is maintained across the gap.

In a similar way the groove 50 can be formed and re-formed in the smaller diameter notch grinding wheel 48.

The disc 56 may be permanently mounted on a work spindle in an edge grinding machine or may be adapted to be mounted on the workpiece holder which may comprise for example a vacuum chuck.

Figure 4:
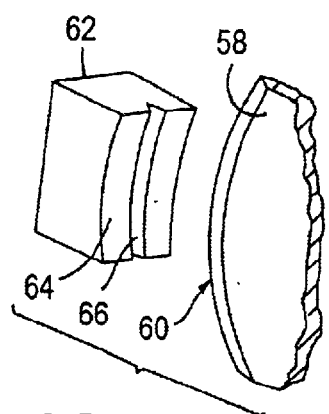
FIG. 4 is a perspective view of an arcuate electrode which can be used for forming and re-forming by electro-discharge machining, the periphery of an edge forming wheel carried by a work spindle in an edge grinding machine.

To the rear of the vacuum chuck may be mounted a forming wheel as shown in FIG. 4. Here the wheel is only partly shown at 58 but essentially comprises a circular disc the cross-section of which is similar to that shown in FIG. 1 for the workpiece. The edge of the disc 58 is formed with a similar triangular cross-section profile generally designated 60 that is similar to the edge profile to be formed around the workpiece and for convenience and maximum accuracy and speed, the groove 42 in the edge forming wheel 32 of FIG. 3 may be formed and re-formed in situ by simply moving the wheel 32 axially so that the groove 42 aligns with the forming wheel 58 and bringing the two wheels together so that the periphery 60 of the forming wheel 58 removes the material to form the groove 42 in the first place, or simply re-forms the groove as required as the wheel 32 becomes worn.

The triangular cross-section of the edge of the forming wheel may itself be formed and re-formed in situ by electro-discharge machining using an arcuate electrode 62 having formed in its curved surface 64 a complementary groove 66, the cross-section of which is similar to the triangular section of the workpiece shown in FIG. 1 which is to be formed around the forming wheel 58 in the region denoted by 60. The electro-discharge process is performed by establishing an electric current in known manner between the electrode 62 and the forming wheel 58 and for this purpose the forming wheel must be conductive and is typically a metal bonded wheel.

What is claimed is:

1. A method of conditioning a grinding wheel comprising grinding grit in which a groove has been formed, comprising the steps of engaging the unconditioned groove with part of the periphery of a wafer workpiece, rotating the wafer through a small angle so as to perform a shallow grind over a small arcuate extent of the rim of the wafer, disengaging the wheel from the wafer and axially shifting the wheel or the wafer before re-engaging and performing a similar grind over another arcuate region of the wafer and performing a sequence of such steps around part or all of the circumference of the wafer thereby removing bonding material from the surface of the groove in the grinding wheel and exposing the grinding grit, and thereby condition the wheel.

2. A method according to claim 1 in which the depth to which each of the arcuate grinds is performed is limited so as not to encroach into the useful material from which the wafer is constructed, so that a final grinding process performed on the wafer to remove the remainder of the extraneous material from the periphery of the wafer will still leave a full size wafer with a correctly formed profile around its periphery.

3. A method according to claim 2 for forming and re-forming grinding wheels, particularly metal bonded grinding wheels, which is performed in situ.

4. A method according to claim 1 for forming and re-forming grinding wheels, particularly metal bonded grinding wheels, which is performed in situ.

5. An edge grinding machine in which a workpiece is rotated relative to a rotating grinding wheel having a groove formed in its surface for grinding the periphery of the workpiece to size and shape, in which a spark erosion electrode is mounted for rotation with the workpiece, and the wheel to be formed and reformed is axially shifted and advanced, so that the region thereof which is to be formed with a groove or containing a groove which is to be re-formed can be engaged by the spark erosion electrode as the latter rotates about the workpiece axis, and forming and re-forming of the groove in the grinding wheel is performed by rotating the grinding wheel at high speed while simultaneously rotating the electrode around the workpiece axis so that spark erosion is performed around the whole of the circumference of the groove.

6. A method of forming the external peripheral surface of a forming wheel carried by a work spindle, in which the forming wheel is used to form and re-form grooves in grinding wheels for grinding an edge profile and a notch profile in a wafer mounted for rotation about the same axis as the forming wheel, and in which a stationary grooved electrode is mounted to the machine and is adapted to be moved into close proximity to the edge of the forming wheel mounted on the workpiece spindle so that part of the arcuate extent of the said circumference is embraced by a groove within the electrode, and electro-discharge machining is performed as the forming wheel is rotated so as to form the desired profile around the periphery of the forming wheel to enable it to continue to perform its forming and re-forming task.

7. A method according to claim 6 in which the electro-discharge machining comprises spark erosion.

8. A method according to claim 7 when used for grinding wheels.

9. A method according to claim 6 when used for grinding wheels.

10. A machine having fitted thereon an arcuate electrode adapted to be moved towards and away from the circumferential edge of a forming wheel, the forming wheel being mounted on a work spindle to the rear of a workpiece mounting device such as a vacuum chuck, and means for advancing the electrode so that a groove therein embraces the edge of the forming wheel to allow electro-discharge machining to be performed on the circumferential edge of the forming wheel.

11. A machine according to claim 10 in which the forming wheel is a metal bonded grinding wheel used as an electrode in an electro-discharge machining process for forming and re-forming grooves in edge grinding wheels and notch grinding wheels mounted on the same edge grinding machine.

12. A machine according to claim 11 in which both the wheel and electrode are rotated.

13. A machine according to claim 11 in which the electrode is located to the rear of a vacuum chuck on which is normally mounted a disc-like workpiece whose periphery is to be ground.

14. A machine according to claim 11 in which a separate disc electrode is employed which is also adapted to be mounted on the workpiece mounting device attached to the workpiece spindle for rotation thereby in place of a workpiece.

15. A machine according to claim 10 in which both the wheel and electrode are rotated.

16. A machine according to claim 15 in which the electrode is located to the rear of a vacuum chuck on which is normally mounted a disc-like workpiece whose periphery is to be ground.

17. A machine according to claim 15 in which a separate disc electrode is employed which is also adapted to be mounted on the workpiece mounting device attached to the workpiece spindle for rotation thereby in place of a workpiece.

18. A machine according to claim 10 in which the electrode is located to the rear of a vacuum chuck on which is normally mounted a disc-like workpiece whose periphery is to be ground.

19. A method of operating a machine according to claim 18 in which the profile of the ground periphery of the workpiece is measured using an optical inspection system enabling the profile to be checked by eye, to be checked against a profile or to be optically projected onto a photoelectric device such as a CCD camera, whereby a video signal can be produced for processing and/or display on a visual display unit.

20. A method according to claim 19 in which video signals are obtained, are stored, processed, and compared with template signals, subjected to an algorithm to determine the shape of the device which produces the signals, and are measured and investigated to determine the correctness or lack of correctness of the ground profile.

21. A method according to claim 19 in which signals are displayed on a visual display unit, the enlarged display of the profile being checked by eye and/or checked against an optical profile device offered up to the screen of the visual display unit for comparison.

22. A machine according to claim 10 in which a separate disc electrode is employed which is also adapted to be mounted on the workpiece mounting device attached to the workpiece spindle for rotation thereby in place of a workpiece.

23. A method of operating a machine according to claim 22 in which the profile of the ground periphery of the workpiece is measured using an optical inspection system enabling the profile to be checked by eye, to be checked against a profile or to be optically projected onto a photoelectric device such as a CCD camera or the like, whereby a video signal can be produced for processing and/or displaying on a visual display unit.

24. A method of positioning a grooved grinding wheel relative to a disc-like circular workpiece for edge grinding the latter using the groove in the wheel to produce two converging frustoconical surfaces around the rim of the workpiece, comprising the steps of mounting the workpiece for rotation about a first axis, mounting the grooved grinding wheel for rotation about a second parallel axis, effecting relative movement between the workpiece and the wheel to engage the rim of the wheel within the groove, performing a preliminary grind, separating the wheel from the workpiece, measuring the peripheral rim of the workpiece to determine the accuracy of its form relative to a template or to stored data relating to the desired form, axially adjusting the position of the wheel and therefore the groove in response to the measurements made in the profile of the rim produced by the preliminary grind, re-grinding the rim with a second preliminary grind with the grinding wheel located at the axially shifted position, measuring the profile of the ground rim of the workpiece as before, adjusting the axial position of the grinding wheel again, re-grinding the ground periphery of the workpiece and repeating the measuring and axial shifting steps until the rim profile possesses the desired accuracy, and utilizing the final position of the grooved grinding wheel for grinding future wafers.

25. A method according to claim 24, in which the sequence of preliminary grinds are formed one after the other around the rim of the circular workpiece, with a small axial shift of the grinding wheel between each preliminary grind, each said preliminary grind being performed over only a small arcuate extent of the overall circumference of the rim, the rotational position of each said preliminary grind and the corresponding axial position of the grooved grinding wheel being noted and stored for future reference, and the profile obtained by each of the succession of preliminary grinds is measured, and the axial position for future grinds is determined by reference to the result obtained from each of the different preliminary grinds by selecting the axial position for the wheel which gave the best profile.

26. A method according to claim 25 in which the preliminary grinds are measured while the workpiece is still mounted in the grinding station, or in which the workpiece is de-mounted and taken to an inspection location for the preliminary grinds around its periphery to be measured.

27. A method according to claim 25 in which the preliminary grinds do not encroach into the final size of the wafer so that after the succession of preliminary grinds has been completed and the correct position for the grooved grinding wheel has been selected, a final grinding step performed on the wafer will allow the latter to be ground to size with the peripheral profile correctly located relative to the two parallel faces of the wafer.

28. A method according to claim 25 for use in positioning grinding wheels which cannot be formed and re-formed in situ, particularly metal bonded wheels.

29. A method according to claim 24 in which the preliminary grinds are measured while the workpiece is still mounted in the grinding station, or in which the workpiece is de-mounted and taken to an inspection location for the preliminary grinds around its periphery to be measured.

30. A method according to claim 29 in which the preliminary grinds do not encroach into the final size of the wafer so that after the succession of preliminary grinds has been completed and the correct position for the grooved grinding wheel has been selected, a final grinding step performed on the wafer will allow the latter to be ground to size with the peripheral profile correctly located relative to the two parallel faces of the wafer.

31. A method according to claim 29 for use in positioning grinding wheels which cannot be formed and re-formed in situ, particularly metal bonded wheels.

32. A method according to claim 24 in which the preliminary grinds do not encroach into the final size of the wafer so that after the succession of preliminary grinds has been completed and the correct position for the grooved grinding wheel has been selected, a final grinding step performed on the wafer will allow the latter to be ground to size with the peripheral profile correctly located relative to the two parallel faces of the wafer.

33. A method according to claim 32 for use in positioning grinding wheels which cannot be formed and re-formed in situ, particularly metal bonded wheels.

34. A method according to claim 24 for use in positioning grinding wheels which cannot be formed and re-formed in situ, particularly metal bonded wheels.

* * * * *